United States Patent Office 2,994,609

Patented Aug. 1, 1961

2,994,609

DEVELOPMENT OF DIAZOTYPE PRINTING PLATES

Max A. Landau, Irvington, N.J., assignor to Azoplate Corporation, Summit, N.J., a corporation of New Jersey No Drawing. Filed Sept. 25, 1956, Ser. No. 612,046
10 Claims. (Cl. 96—49)

My present invention relates to developers for diazotype printing plates and to a method of developing such plates therewith. More particularly it concerns the development of images on metal printing plates, which images are formed by means of certain water insoluble, light sensitive diazo compounds.

In recent years there has become known and widely practiced a method of producing photomechanical printing plates for use in the graphic arts, that involves the employment of light sensitive diazo compounds. Such plates are sensitized by coating thereon a solution of the light sensitive diazo compound. Upon evaporating the solvent a very thin layer consisting of the light sensitive diazo compound is formed on the surface of the plate. The sensitized plate is then exposed to a light image, for example to a source of strong light underneath a partly transparent pattern, whereby those portions of the diazo compounds that are exposed to the light undergo a chemical reaction, while those that are protected from such exposure remain unchanged. A reproduction of the image is thereafter formed on the plate, i.e. it is developed, by removing either the reaction products or the unexposed diazo compound, thus producing a positive or a negative image, respectively. The material remaining on the plate is capable of retaining greasy lithographic inks, so that the thus treated plate may be used for offset printing purposes.

One customarily employs printing plates composed of an amphoteric metal, such as aluminum or zinc, or of alloys in which such metals predominate. The printing surfaces of these plates are cleaned and may be roughened, if desired, and then coated with solutions containing the light sensitive diazo compounds. The latter are generally water insoluble or only sparingly so, and are therefore applied as solutions in organic solvents, which may advantageously contain additions to inhibit crystallization of the diazo compounds.

Among the light sensitive diazo compounds that have been proposed for use in the production of such printing plates there is an outstanding group composed of the sulfonic or carboxylic acids, the sulfonic or carboxylic acid radicals of which are esterified or amidated, of benzoquinone diazides or naphthoquinone-(1,2)-diazide-(2) or naphthoquinone-(1,2)-diazide-(1). These diazo compounds are preferred in practice, because of their excellent stability which permits long storage of the sensitized plates, coupled with a desirable degree of light sensitivity which facilitates the handling thereof and exposure to the image-forming light. These light sensitive diazo compounds are water insoluble or substantially so and are applied to the surface of the metal plates by a variety of known coating procedures, usually at a concentration of from 1 to 4 percent in organic solvents.

The use of the aforesaid esters and amides of sulfonic or carboxylic acids of ortho-quinone diazides of the benzene and the naphthalene series for sensitizing printing plates has been fully described in the German Patents Nos. 865,109; 879,203; 888,204, and 894,959. The development of such printing plates may be accomplished by means of dilute aqueous acid or alkaline solutions. If the diazo compound chosen possesses a basic character and is exposed to light underneath a negative film, one may obtain a positive image by development with a dilute mineral acid, preferably phosphoric acid. Such an image may also be obtained in case the diazo compound possesses an acid or more neutral character, is exposed to light under a positive film and is developed with a dilute aqueous solution of a basic salt, preferably an alkali metal phosphate. The efficiency of the development thus depends upon the degree to which the diazo compound has been rendered resistant to the action of the developer by the photochemical process which consists of a decomposition and a transformation of the chemical structure of the sensitizer. Considerable care must be exercised in the developing treatment to attain a satisfactory action of the aqueous developer. Generally the concentration of the developer, particularly that of the phosphoric acid or its basic salts, should be kept below 6 percent by weight.

It is generally desirable also to apply an acid etching treatment to the developed printing plate, in order to impart to the portions of the metal surface from which the coating was removed an irreversible, water conductant (hydrophilic) character. This will prevent adherence of the greasy printing ink to such portions of the plate, thus assuring a cleaner printed reproduction. A dilute aqueous solution of phosphoric acid is preferred for such etching treatment. However, in the case of a basic character of the light sensitive diazo compound and of the application of a mineral acid, preferably dilute phosphoric acid, as a developer, the bare surface of the plate outside the image is etched and rendered water conductant during development.

In the German Patent No. 922,506 there has been described a process for developing negative images from exposed printing plates sensitized by means of the aforementioned diazo compounds, which involves the use of organic solvents. These organic solvents are generally water miscible and used in mixture with water. The addition of various water soluble salts is recommended. A preferred developer described in the patent consists of a mixture of 50 g. of calcium chloride dissolved in 75 cc. of water and from 40 to 308 cc. of ethyl alcohol. Mention is also made of the use of water immiscible organic solvents, such as benzene, xylene and the like, and it is indicated that these can be employed as dispersions with water. In a number of the examples showing development with aqueous solutions of water miscible organic solvents an aftertreatment of the developed plate with dilute phosphoric acid is mentioned. However, the two examples which show the use of water immiscible organic solvents (tetrahydronaphthalene and xylene as such) do not include such aftertreatment.

The principal object of my invention is to overcome the drawbacks of prior art developing processes and assure production of large numbers of satisfactory prints from the developed plates. Another object is to provide a convenient form of developer which can safely and effectively be employed, by unskilled operators. Further objects will become apparent from the following description of my invention.

I have found that the foregoing objects can be attained by the use of a developer that essentially comprises an emulsion of a water immiscible organic solvent in a dilute aqueous solution of phosphoric acid and gum arabic. By "water immiscible" I mean a solvent that is not dissolved in water in a proportion exceeding 1 percent of the water. The optimum such solvent to be employed may vary with the diazo compound used, but I have found that tetrahydronaphthalene is outstandingly suitable for the practice of my invention. Its action may in some cases be improved by admixing therewith minor proportions of another water immiscible organic solvent.

The dilute aqueous phosphoric acid employed in the homogeneous phase of my developer emulsion preferably has a concentration of from about 2 to about 6 percent. I found that it is very suitable to dissolve phosphorus pentoxide (phosphoric anhydride) in a diluted aqueous solution of gum arabic of 4 to 14° Bé. Such a solution of phosphoric acid appears to serve a number of useful functions, including that of etching the areas of the plate outside the image, which have not been exposed to light and from which the unchanged diazo compound was removed by the developer, thereby rendering them hydrophilic and assuring clean prints. The phosphoric acid also prevents a coagulation and precipitation of the gum arabic and keeps that colloid in solution. The water immiscible organic solvent constitutes the minor portion of my developer, and I prefer to employ from about 10 to about 40 parts by volume for each 100 parts of dilute phosphoric acid and gum arabic in making up the emulsions.

My novel developer emulsion is simply prepared by mixing the water immiscible organic solvent, particularly tetrahydronaphthalene, with a solution of phosphoric acid in aqueous gum arabic in the desired proportions, and then intensely agitating the mixture. In order to achieve satisfactory stability of the emulsions for commercial purposes, it is advisable to subject them to an homogenizing treatment undet elevated pressure in a high-pressure homogenizing machine, such as the homogenizers manufactured by the Manton-Gaulin Manufacturing Co., Inc. The minimum required stability of the emulsions is assured by the gum arabic present. Thus one obtains homogenized emulsions which may be stored for months under the usual conditions, and whose uniformity will be quickly restored upon light shaking. Such emulsions are eminently suitable for developing purposes, as will be described. Emulsification and homogenization are improved by employing somewhat elevated temperatures up to about 50° C.

Printing plates of amphoteric metal, which have been sensitized in the known manner with light sensitive diazo compounds such as sulfonic or carboxylic aids, the sulfonic or carboxylic acid radicals of which are esterified or amidated, of benzoquinone diazides or naphthoquinone - (1,2) - diazide - (2) or naphthoquinone - (1,2)-diazide-(1), are exposed as usual to a strong actinic light underneath a pattern to form a latent image on the sensitized surface of the plate. These light sensitive diazo compounds generally possess a basic character. The latent image so produced therewith may simply and efficiently be converted to a printing image which is the reverse of the pattern employed by means of my novel homogenized developer emulsion. This is accomplished by applying the same to the exposed surface of the plate, causing it to remain in close and even contact with said surface for a brief period, removing the excess developer, and then rinsing the developed plate with water. Generally the latent image on the plate will be faintly visible due to a change in color from the diazo compound to its light reaction product.

A uniform, intimate contact of my developer emulsion can be assured by lightly rubbing it on to the entire exposed surface of the plate by means of some absorbent material such as absorbent cotton or a sponge. One will notice immediately that the unexposed portions of the originally light sensitive layer begin to dissolve, exposing the amphoteric metal underneath and forming a clearly visible, reverse image composed of the portions that were exposed to light. After wiping off the excess developer and rinsing the developed plate several times with water, one obtains a plate ready for printing without need for any further treatment. The image formed by the light decomposition products readily takes up the usual fatty lithographic inks which are repelled by the bared metal surfac outside the image, and one may obtain thousands of printed copies from such a plate in the usual offset printing process.

The time required for optimum development of the plate by means of my developer emulsions will vary depending upon a number of factors, such as the light sensitive diazo compound used and the water immiscible organic solvent used, but particularly upon the length of time elapsed between the coating and the using of the plate. The optimum degree of development may be determined by observation of the printing image formed, particularly the laying bare of the metal surface outside the image, and the development is then terminated by the removal of the developer. A great many sensitized plates which were stored for six months or even less before use could not be developed by means of a dilute aqueous phosphoric acid solution. However, they were quickly and completely developed by means of my novel developer emulsions.

The following examples are given merely to illustrate how my invention may be practiced. It should be understood that the invention is not limited to the specific materials and conditions given in these examples.

*Example 1*

86.16 grams of phosphorous pentoxide (phosphoric anhydride) which is equivalent to 60 cc. of an 85% phosphoric acid were dissolved in 1440 cc. of an 8° Beaumé aqueous solution of gum arabic and slowly warmed up to about 40° C. Thereupon 500 cc. of tetrahydronaphthalene were slowly added while vigorously stirring in a suitable mixing device and cooling to insure that the temperature of the mixture does not substantially exceed 40° C. during the mixing step. After addition of the tetrahydronaphthalene, the mixing was continued for about 15 minutes. The resultant emulsion was then pumped into a Manton-Gaulin high pressure homogenizing machine in which it was forced through nozzles under a pressure of about 3500 lbs. per square inch. The resultant homogenized developer emulsion was poured into suitable containers, such as glass bottles, where it was stored until use.

A printing plate of grained aluminum was sensitized by applying a solution of 2 grams of a light sensitive diazo compound in 100 cc. of monomethyl glycol ether in a customary manner. The diazo compound chosen had the structural formula:

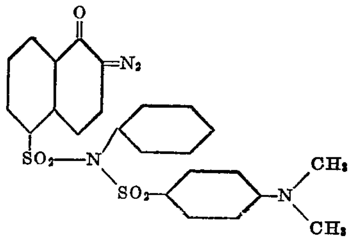

and was prepared by the reaction of 1-dimethyl-amino-benzene - 4 - sulfochloride with naphthoquinone - (1,2) - diazide-(2)-5-sulfoanilide in the presence of caustic soda. The thus sensitized plate was stored with exclusion of light for about nine months and was then exposed for two minutes under a negative film to the light of an arc lamp. A faint latent image was formed by a deepening of the yellow coloration of the sensitized layer in those areas that were exposed to the printing light.

The thus exposed plate was then developed by means of the above described homogenized developer emulsion. About 15 to 18 cc. of this emulsion were applied to a plate having an exposed surface of 10 by 16 inches, and the emulsion was carefully spread over the entire surface by means of a wad of absorbent cotton. Uniform light rubbing with the cotton wad was continued, until the metal surface was revealed at those areas that were protected from the printing light. The excess developer was then wiped off with a clean cotton wad, and the plate rinsed off several times with water. Thereupon a reversed printing image of the negative film copied was clearly apparent. The developed plate was used in an offset press to furnish many thousands of printed positive reproductions of the negative film.

*Example 2*

Substantially the same results were obtained by repeating the procedure described in the foregoing example and employing a developing emulsion composed of 40 parts of tetrahydronaphthalene in 60 parts of a dilute aqueous phosphoric acid and gum arabic solution. The latter was produced by adding 4 parts of an 85% phosphoric acid to 96 parts by volume of a 14° Bé. gum arabic.

This developer was then employed to develop a latent image produced on a zinc plate by means of a light sensitive diazo compound formed by the reaction of naphthoquinone-(1,2)-diazide-(2)-5-sulfoanilide dissolved in dioxane with a solution of 7'-sulfochloride-2-ethyl-N-(n-propyl)-naphtho-(1',2':4,5)-imidazole in dioxane.

*Example 3*

Another suitable developer emulsion was prepared as follows. 15 grams of β-naphthyl methyl ether were dissolved in 100 grams of tetrahydronaphthalene. In addition, 4 cc. of an 85% phosphoric acid were dissolved in 96 cc. of a 6° Bé. aqueous solution of gum arabic. The emulsion was formed by thoroughly mixing 30 parts of the solution of β-naphthyl methyl ether in tetrahydronaphthalene with 70 parts of the solution of phosphoric acid and gum arabic, after both solutions had been heated to about 40° C. The premixed developer was then homogenized as described before.

Such developer emulsion was particularly effective for developing aluminum plates sensitized by means of a mixture of 25% by weight of the light sensitive diazo compound of Example 2 and 75% of 2,4,4'-trihydroxydiphenyl esterified with 3 moles of naphthoquinone-(1,2)-diazide-(2)-5-sulfonic acid. The mixture of the two diazo compounds was dissolved in monomethylglycolether in a concentration of 1.5%, and the solution was applied on the plate by means of a whirler. The sensitized plate was exposed under a pattern to a strong actinic light for about 2 min. and was developed and etched in one operation by the developer emulsion. When put on the offset printing press, the plate gave over 10,000 good prints.

*Example 4*

Another suitable developer emulsion was prepared by dissolving 20 grams of β-naphthylethyl-ether in 100 cc. of tetrahydronaphthalene. In addition, 4.5 cc. of an 85% phosphoric acid which is equivalent to about 6.46 grams of phosphorus pentoxide were dissolved in 100 cc. of an aqueous solution of gum arabic of 8° Bé.

60 parts of the aqueous and 40 parts of the oily component were heated up to about 40° C. and emulsified by a suitable premixture. The emulsion was passed through a Manton-Gaulin high pressure homogenizer at a pressure of 3500 lbs. per square inch.

An aluminum plate which had been grained was coated with a light sensitive solution by dipping the plate in the solution. The sensitizing solution consisted of a 1.5% solution of an imino-quinone-diazide of the formula:

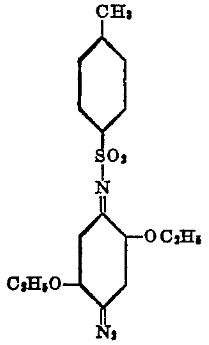

in methyl-isobutylketone. The plate was dried and exposed under a negative film for 2 minutes to an actinic light. It was developed with the above described developer emulsion. When inked up on an offset press the plate accepted the greasy printing ink only in the area of the image, and showed no toning or other defects outside the image. 15,000 good copies were printed therewith.

*Example 5*

15 grams of naphthalene were dissolved in 100 cc. of tetrahydronaphthalene. The preparation of the developer emulsion was otherwise identical to that described in Example 4.

An aluminum sheet, sensitized with a 1.2% solution in monomethylglycolether of a diazo compound of the formula

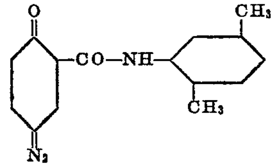

by dipping it therein, was exposed about 10 months after production under a negative film to actinic light. The exposed plate was developed with the above described developer emulsion. When inked up on the press, no scum or other defects appeared in the non-printing areas.

I claim:

1. A process for developing a printing plate comprising a base material having a coating thereon comprising a compound selected from the group consisting of iminoquinone diazides and esters and amides of benzoquinone diazides and naphthoquinone diazides which comprises exposing the plate to light under a master and treating the exposed plate with a developer consisting essentially of a water insoluble organic solvent emulsified in a dilute aqueous solution of phosphoric acid and gum arabic, whereby those portions of the compound which were not exposed to light are removed.

2. A developer adapted for the development of diazo type printing plates, consisting essentially of an emulsion of a water insoluble organic solvent in a dilute aqueous solution of phosphoric acid and gum arabic.

3. A developing process as claimed in claim 1, wherein the developer emulsion contains from about 10 to about 40 parts by volume of water insoluble organic solvent for each 100 parts of dilute aqueous phosphoric acid and gum arabic.

4. A developing process as claimed in claim 3, wherein the water insoluble solvent is predominantly composed of tetrahydronaphthalene, the dilute phosphoric acid has a concentration of from about 2 to about 6%, and the gum arabic has a gravity of from 4 to 14 Bé.

5. A developer as claimed in claim 2, wherein the water insoluble organic solvent is composed predominantly of tetrahydronaphthalene.

6. A developer as claimed in claim 5, wherein the dilute phosphoric acid has a concentration of from about 2 to about 6% and the gum arabic has a gravity of 4 to 14° Bé.

7. A developer as claimed in claim 2 which has been subjected to an homogenizing treatment.

8. A process for preparing a developer emulsion which comprises intensely agitating a mixture consisting essentially of a water insoluble organic solvent in a dilute solution of phosphoric acid and gum arabic, and then subjecting such mixture to an homogenizing treatment.

9. A process as claimed in claim 8, wherein the intense agitation and subsequent homogenization are conducted at somewhat elevated temperatures up to 50° C.

10. A process as claimed in claim 9, wherein the organic solvent is tetrahydronaphthalene, the phosphoric acid has a concentration of from about 2 to about 6% and the gum arabic has a gravity of 4 to 14° Bé.

(References on following page)

References Cited in the file of this patent

UNITED STATES PATENTS

| | | |
|---|---|---|
| 2,192,482 | Schroeder | Mar. 5, 1940 |
| 2,209,291 | Witty | July 23, 1940 |
| 2,229,051 | Dell | Jan. 21, 1941 |
| 2,626,866 | Neugebauer et al. | Jan. 27, 1953 |
| 2,702,243 | Schmidt | Feb. 15, 1955 |
| 2,714,066 | Jewett et al. | July 26, 1955 |
| 2,754,279 | Hall | July 10, 1956 |
| 2,759,817 | Schmidt et al. | Aug. 21, 1956 |

FOREIGN PATENTS

| | | |
|---|---|---|
| 642,782 | Germany | Feb. 25, 1937 |
| 510,151 | Belgium | Apr. 15, 1952 |
| 711,626 | Great Britain | July 7, 1954 |
| 938,233 | Germany | Jan. 26, 1956 |
| 80,662 | Netherlands | Feb. 15, 1956 |

OTHER REFERENCES

Lange: Handbook of Chemistry, 8th ed., 1952, Handbook Pub. Co., Sandusky, Ohio, pages 426 and 427.